(12) United States Patent
Supriya et al.

(10) Patent No.: US 8,017,498 B2
(45) Date of Patent: Sep. 13, 2011

(54) MULTIPLE DIE STRUCTURE AND METHOD OF FORMING A CONNECTION BETWEEN FIRST AND SECOND DIES IN SAME

(75) Inventors: Lakshmi Supriya, Arlington, MA (US); Gloria Alejandra Camacho-Bragado, Chicago, IL (US)

(73) Assignee: Intel Corporation, Santa Clara, CA (US)

( * ) Notice: Subject to any disclaimer, the term of this patent is extended or adjusted under 35 U.S.C. 154(b) by 305 days.

(21) Appl. No.: 12/284,531

(22) Filed: Sep. 22, 2008

(65) Prior Publication Data

US 2010/0072617 A1 Mar. 25, 2010

(51) Int. Cl.
*H01L 21/30* (2006.01)
(52) U.S. Cl. ........ 438/456; 438/457; 438/458; 438/618; 257/737; 257/E51.04; 257/E51.039
(58) Field of Classification Search ............. 257/E51.04, 257/E51.039, 737; 438/456–458, 618
See application file for complete search history.

(56) References Cited

U.S. PATENT DOCUMENTS

| | | | |
|---|---|---|---|
| 2004/0233649 A1* | 11/2004 | Honlein et al. | 361/760 |
| 2006/0113656 A1* | 6/2006 | Uang et al. | 257/690 |

OTHER PUBLICATIONS

Vajtai, Robert, et al., Ch. 8, "Chemical Vapor Deposition of Organized Architectures of Carbon Nanotubes for Applications", pp. 188-211.
Georgiev, G., et al., "A Molecular Approach to Orienting and Sorting Carbon Nanotubes for Electromechanical Devices", Abstract No. II20.43, 1 pg.
Tao, X.Y., et al., "Thermal CVD synthesis of carbon nanotubes filled with single-crystalline Cu nanoneedles at tips", Diamond & Related Materials 15 (2006), pp. 1271-1275.
Kordas, Krisztian, et al., "Magnetic-Field Induced Efficient Alignment of Carbon Nanotubes in Aqueous Solutions", Chem. Mater 2007, 19, pp. 787-791.
Ou, Fung Suong, et al., "Template assembly of tube-in-tube carbon nanotubes grown using Cu as catalyst", Letters to the Editor / Carbon 45 (2007), pp. 1696-1716.
Ou, Fung Suong, et al., "Multisegmented one-dimensional hybrid structures of carbon nanotubes and metal nanowires", Applied Physics Letters 89, 243122 (2006), 3 pgs.
Dong, Lixin, et al., "Nanorobotic Spot Welding: Controlled Metal Deposition with Attogram Precision from Copper-Filled Carbon Nanotubes", Nano Letters 2007, vol. 7, No. 1, pp. 58-63.
Dick, Kimberly, et al., "Size-Dependent Melting of Silica-Encapsulated Gold Nanoparticles", vol. 123, No. 10, JACS Articles—J.Am. Chem. Soc. Published on Web Feb. 14, 2002, pp. 2312-2317.
Bachels, Thomas, et al., "Melting of Isolated Tin Nanoparticles", Physcial Review Letters, vol. 85, No. 6, Aug. 7, 2000, pp. 1250-1253.

* cited by examiner

*Primary Examiner* — David Vu
*Assistant Examiner* — Brandon Fox
(74) *Attorney, Agent, or Firm* — Kenneth A. Nelson (57) ABSTRACT

A multiple die structure includes a first die (110), a second die (120), a carbon nanotube (130) having a first end (131) in physical contact with the first die and having a second end (132) in physical contact with the second die, and an electrically conductive material (240) in physical contact with the first end of the carbon nanotube and in physical contact with the first die. Forming a connection between the first die and the second die can include providing a connection structure (400, 500, 600, 900) in which the electrically conductive material is adjacent to the carbon nanotube, placing the connection structure adjacent to the first die and to the second die, and bonding the first die and the second die to the connection structure.

15 Claims, 10 Drawing Sheets

MULTIPLE DIE STRUCTURE AND METHOD OF FORMING A CONNECTION BETWEEN FIRST AND SECOND DIES IN SAME

FIELD OF THE INVENTION

The disclosed embodiments of the invention relate generally to die to die interconnects, and relate more particularly to the low-temperature formation and resulting structure of such interconnects.

BACKGROUND OF THE INVENTION

Computer systems increasingly employ stacked-die architectures because of the space savings and other advantages they offer. Copper-copper interconnects are desirable in stacked die architectures because of copper's high current carrying capability, which leads to low electromigration levels and thus enables power to be efficiently delivered through the entire stack. (Copper will sometimes be referred to herein using its abbreviation "Cu.") Unfortunately, no low temperature method for forming Cu—Cu interconnects currently exists. Instead, current practice typically involves depositing a solder material onto electrically conductive features (e.g., copper pads or bumps) attached to one or both dies and the die to die interconnection is made via the solder. However, these techniques tend to cause various problems, including problematic electromigration levels, poor solder joint reliability, and flux-associated contamination issues.

BRIEF DESCRIPTION OF THE DRAWINGS

The disclosed embodiments will be better understood from a reading of the following detailed description, taken in conjunction with the accompanying figures in the drawings in which.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a multiple die structure comprising a first die having an associated first connection structure, a second die having an associated second connection structure, a carbon nanotube (CNT) having a first end in physical contact with the first connection structure and having a second end in physical contact with the second connection structure, and an electrically conductive material in physical contact with the first end of the CNT and in physical contact with the first connection structure. The CNT may be multi-walled or single-walled. In an embodiment, forming a connection between the first die and the second die of the multiple die structure comprises providing a connection structure comprising a metal adjacent to a CNT, placing the connection structure adjacent to the first die in order to form a first interface between the first die and the connection structure, placing the second die adjacent to the connection structure in order to form a second interface between the second die and the connection structure, and bonding the first die and the second die to the connection structure.

Because CNTs are used as part of the interconnect material, embodiments of the invention enable the formation of die to die interconnects at room temperature with the use of a small voltage. It is known in the art that metal nanoparticles exhibit a lower melting temperature and lower latent heat of fusion than do bulk metals. Since the inner cavity of the CNT is small the metal inside will present a low melting temperature and thus a low voltage (e.g., 0.5 volts) will cause a temperature increase sufficient to melt and release the metal. The molten metal will readily contact the bump and cool down to form a Cu—Cu (or other metal-metal) joint.

The use of CNTs eliminates electromigration issues, improves joint reliability since CNTs are mechanically strong and compliant, and eliminates the need to use flux. Since there is no solder at the interfaces the joint formed will be relatively strong because the absence of intermetallic layers improves joint reliability.

Figure 1:
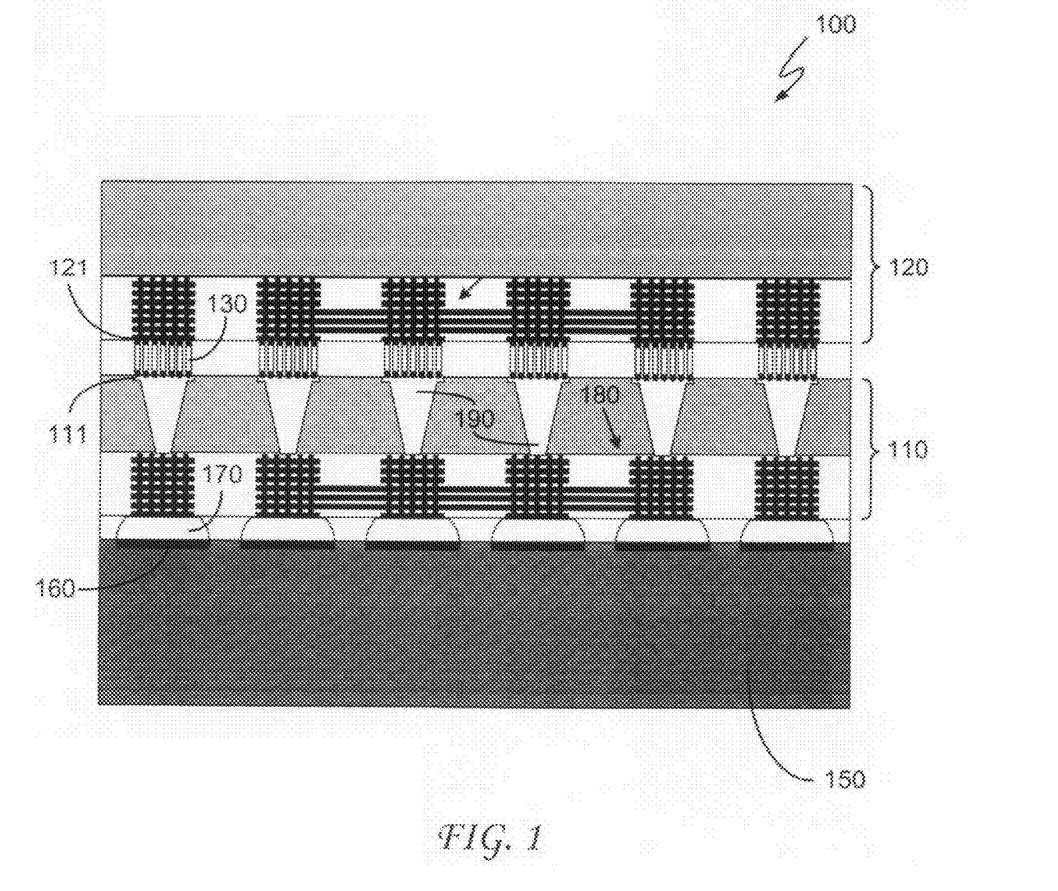
FIGS. 1 and 2 are cross-sectional views of a multiple die structure according to an embodiment of the invention.
Figure 2:
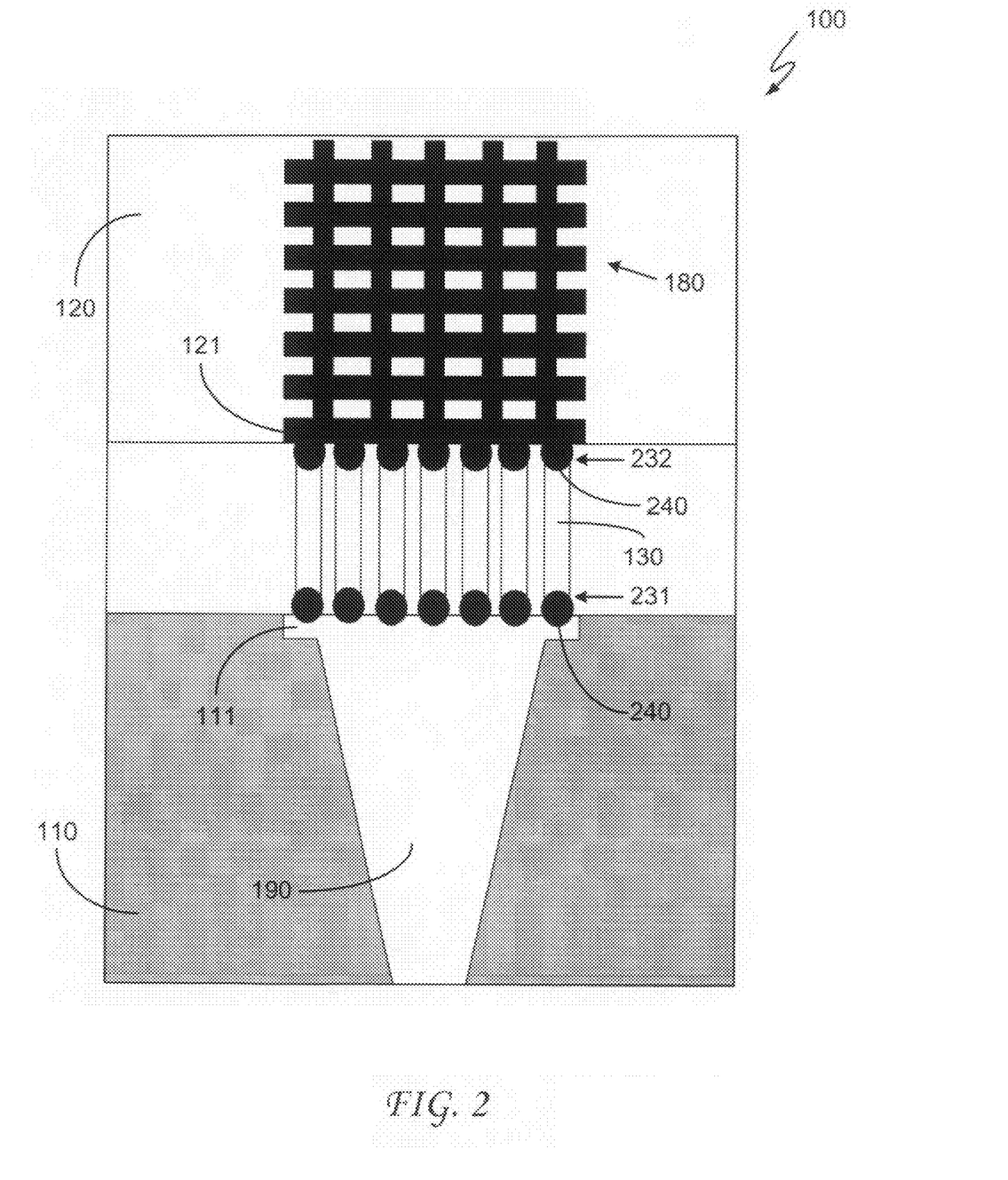

Referring now to the drawings, FIG. 1 is a cross-sectional view of a multiple die structure 100 according to an embodiment of the invention. FIG. 2 is a detail view of a portion of FIG. 1. As illustrated in FIGS. 1 and 2, multiple die structure 100 comprises a die 110 having an associated connection structure 111, a die 120 having an associated connection structure 121, a carbon nanotube 130 having an end 231 adjacent to connection structure 111 and having an end 232 adjacent to connection structure 121, and an electrically conductive material 240 in physical contact with end 231 of carbon nanotube 130 and in physical contact with connection structure 111. In the illustrated embodiment die 110 and die 120 are stacked in a vertical relationship. Other embodiments may feature other die arrangements, including planar (non-stacked) arrangements.

In the illustrated embodiment, electrically conductive material 240, which as an example may be copper or another metal, is in physical contact with end 231 and with end 232 of carbon nanotube 130 and also in physical contact with connection structure 111 and with connection structure 121. In a non-illustrated embodiment, electrically conductive material 240 is located only at one end or the other, with the joint to be formed at the end lacking electrically conductive material 240 to be formed in some other fashion as dictated by the particular embodiment.

Multiple die structure 100 further comprises a substrate 150 and electrically conductive pads 160 and solder bumps 170 that connect die 110 to substrate 150. (In a non-illustrated embodiment, solder bumps 170 could be replaced with a CNT-based interconnect using copper bumps or the like.) Dies 110 and 120 each comprise circuitry 180 that may include transistors and the like. Die 110 also comprises through silicon vias (TSVs) 190.

As an example, connection structures 111 and 121 can comprise a copper pad, a copper bump, or the like. As another example, electrically conductive pads 160 can likewise comprise copper, as can electrically conductive material 240. It should be noted, in fact, that an embodiment in which connection structures 111 and 121, electrically conductive pads 160, and electrically conductive material 240 each comprise copper may well offer performance that is superior to other embodiments. One reason for this may be that since there is only one metal constituting the joint no intermetallic compounds are formed and thus the reliability of the joint is expected to be higher than regular solder-Cu joints. Other reasons contributing to the superior performance of copper have been mentioned above.

It should be noted further that many of the foregoing performance advantages may be obtained with materials other than copper provided that the same material that is used for connection structures 111 and 121 is also used for electrically conductive pads 160 and electrically conductive material 240. It should also be noted that embodiments where connection structures 111 and 121, electrically conductive pads 160, and electrically conductive material 240 are not all made of the same material may still offer at least some of the advantages offered by embodiments where each of the stated components are made of the same material.

Figure 3:
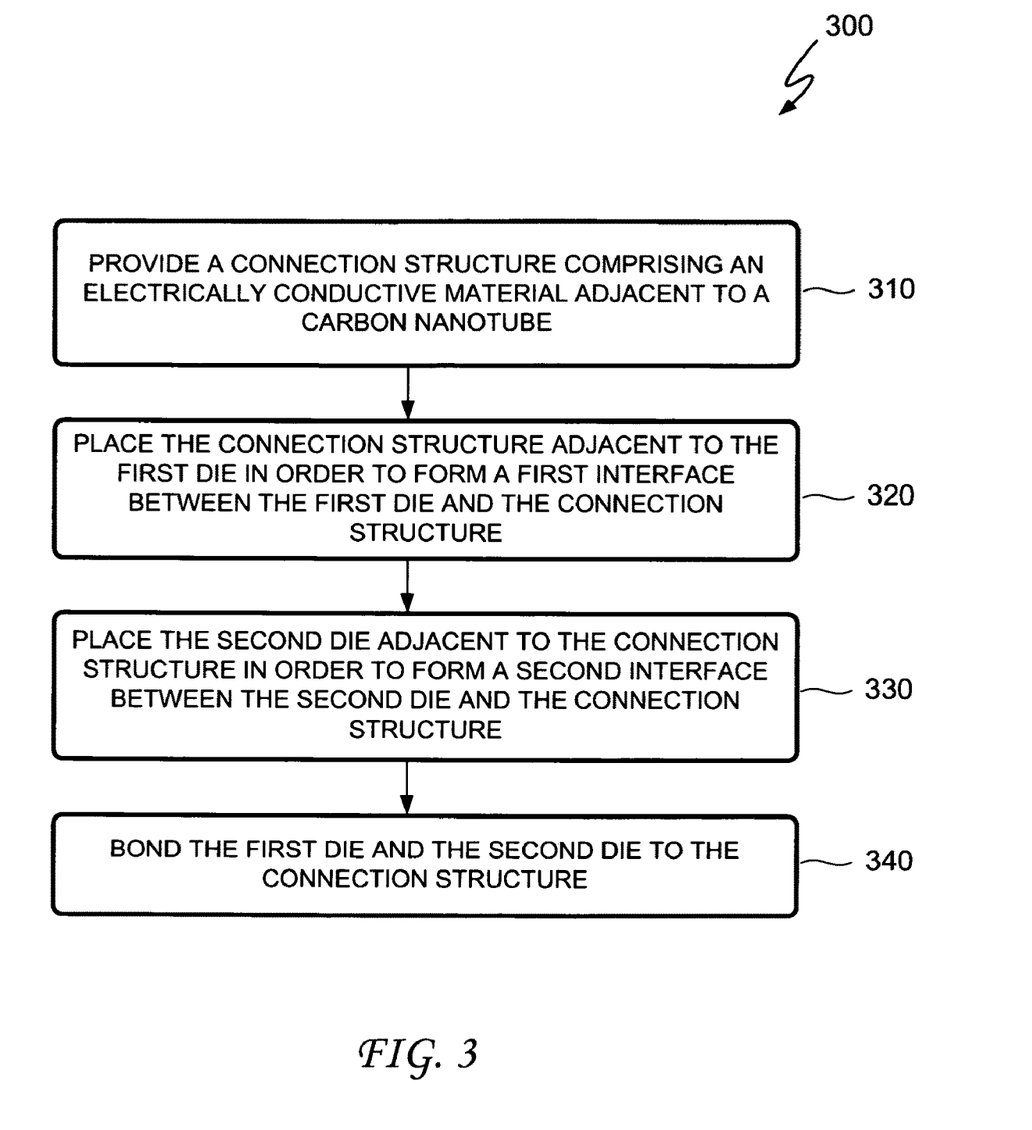
FIG. 3 is a flowchart illustrating a method of forming a connection between a first die and a second die of a multiple die structure according to an embodiment of the invention.

FIG. 3 is a flowchart illustrating a method 300 of forming a connection between a first die and a second die of a multiple die structure according to an embodiment of the invention. In at least one embodiment, the connection is both a physical and an electrical connection. As an example, method 300 may result in the formation of a multiple die structure that is similar to multiple die structure 100 that is shown in FIG. 1.

A step 310 of method 300 is to provide a connection structure comprising an electrically conductive material adjacent to a carbon nanotube. As an example, the electrically conductive material and the carbon nanotube can be similar to, respectively, electrically conductive material 240 and carbon nanotube 130, both of which are shown in at least one of FIGS. 1 and 2.

A step 320 of method 300 is to place the connection structure adjacent to the first die in order to form a first interface between the first die and the connection structure.

A step 330 of method 300 is to place the second die adjacent to the connection structure in order to form a second interface between the second die and the connection structure.

A step 340 of method 300 is to bond the first die and the second die to the connection structure. Multiple methods for accomplishing the bonding of step 340 are contemplated. At least some of these are somewhat dependent on certain physical characteristics of the carbon nanotube, as will be further discussed in the following paragraphs.

Figure 4:
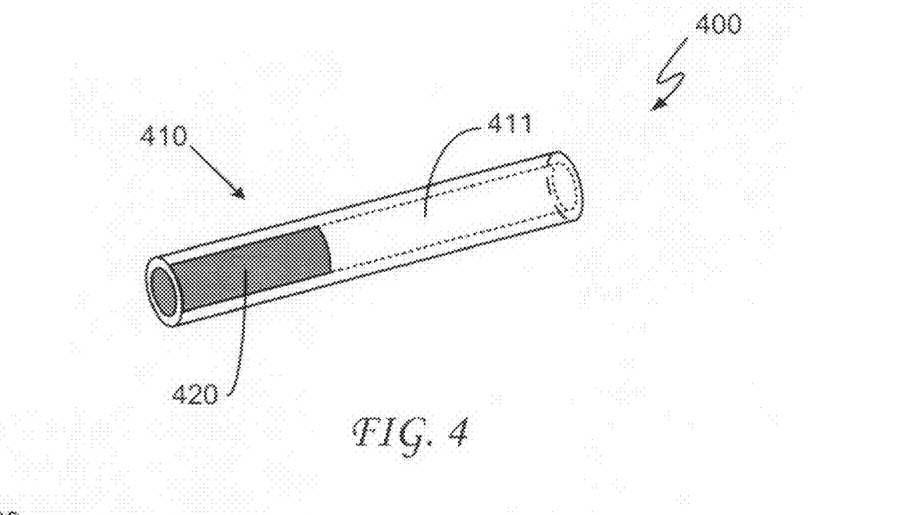
FIGS. 4-6 are cross-sectional views of connection structures according to various embodiments of the invention.

In one embodiment, the carbon nanotube comprises an interior space and the electrically conductive material (e.g., a metal) is contained within the interior space. This is shown in FIG. 4, which is a cross-sectional view of a connection structure 400 according to an embodiment of the invention. It should be noted that the connection structure introduced above in conjunction with step 310 can, as an example, be similar to connection structure 400.

As illustrated in FIG. 4, connection structure 400 comprises a carbon nanotube 410 having an interior space 411 with an electrically conductive material 420 contained within interior space 411. As an example, electrically conductive material 420 can comprise metals including copper, nickel, platinum, palladium, and any other metals that may act as a catalyst for growing CNTs. Accordingly, electrically conductive material 240, first introduced above in the discussion of FIG. 2, can comprise any of the foregoing metals.

In one embodiment, and assuming a structure such as that shown in FIG. 4, step 340 comprises applying a first voltage across the first interface in order to cause at least a portion of the metal to flow out of the carbon nanotube and contact the first die at the first interface, and bonding the second die to the connection structure comprises applying a second voltage across the second interface in order to cause at least a portion of the metal to flow out of the carbon nanotube and contact the second die at the second interface. More specifically, the portion of the metal melts, flows out of the carbon nanotube such that it is in physical contact with both the carbon nanotube and the first or second die across the first or second interface, and then cools and re-solidifies in order to bond the carbon nanotube to the first or second die. As an example, the direction in which the metal flows can be controlled by manipulating the polarity of the applied voltage. As another example, the magnitude of the voltage can be between approximately 0.5 volts and approximately 5 to 10 volts. Certain embodiments may require or benefit from even higher voltages.

Figure 5:
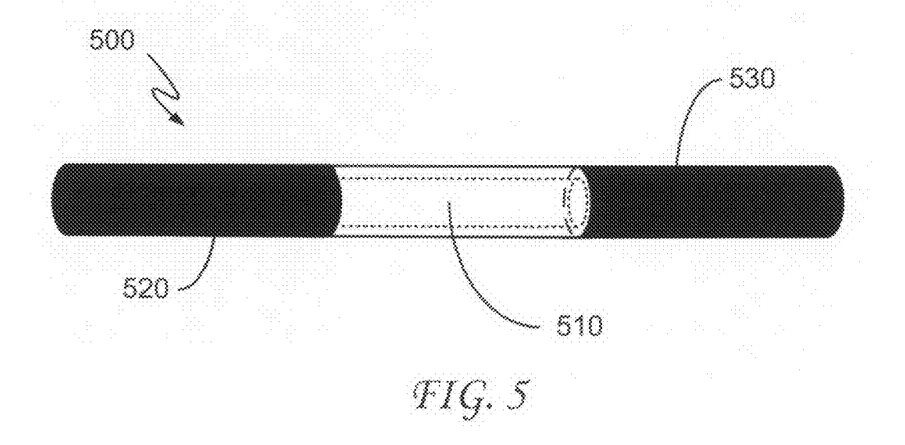

In another embodiment, the connection structure comprises a metal nanowire/carbon nanotube hybrid structure. An example of this is shown in FIG. 5, which is a cross-sectional view of a connection structure 500 according to an embodiment of the invention. It should be noted that the connection structure introduced above in conjunction with step 310 can, as an example, be similar to connection structure 500.

As illustrated in FIG. 5, connection structure 500 comprises a carbon nanotube 510 located between a metal nanowire section 520 and a metal nanowire section 530. Accordingly, the metal of connection structure 500 is located at least at a first end and at a second end of the carbon nanotube. In the illustrated embodiment, the metal is located next to the ends of carbon nanotube 510 with no portion of the metal located inside the carbon nanotube. In a non-illustrated embodiment, either or both ends of carbon nanotube 510 may have some metal from the adjacent metal nanowire section, or a different metal, located inside. In a different non-illustrated embodiment, connection structure 500 comprises carbon nanotube 510 and one (but not both) of metal nanowire sections 520 and 530. As an example, metal nanowire sections 520 and 530 can comprise silver, gold, nickel, platinum, palladium, copper, or the like.

Figure 6:
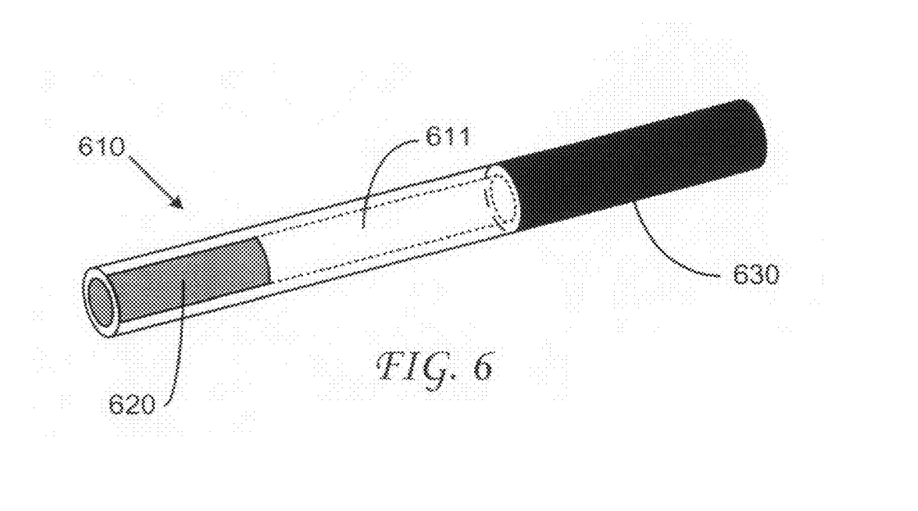

In another embodiment, the connection structure comprises a combination of the connection structures that are illustrated in FIGS. 4 and 5. An example of this is shown in FIG. 6, which is a cross-sectional view of a connection structure 600 according to an embodiment of the invention. It should be noted that the connection structure introduced above in conjunction with step 310 can, as an example, be similar to connection structure 600.

As illustrated in FIG. 6, connection structure 600 comprises a carbon nanotube 610 having an interior space 611 with an electrically conductive material 620 contained within interior space 611. As an example, electrically conductive material 620 can be similar to electrically conductive material 420 that is shown in FIG. 4. Carbon nanotube 610 is adjacent to a metal nanowire section 630. Accordingly, the metal of connection structure 600 is located at least at a first end of the carbon nanotube (e.g., inside the carbon nanotube) and at a second end of the carbon nanotube (e.g., either adjacent to the end of as well as inside the carbon nanotube or else adjacent to the end of but not inside the carbon nanotube).

In one embodiment, and assuming a structure such as that shown in FIG. 5 or 6 (or the described alternatives), step 340 comprises applying a first voltage across the first interface and a second voltage across the second interface in order to melt the metal such that the first die and the second die become bonded to the carbon nanotube.

Figure 7:
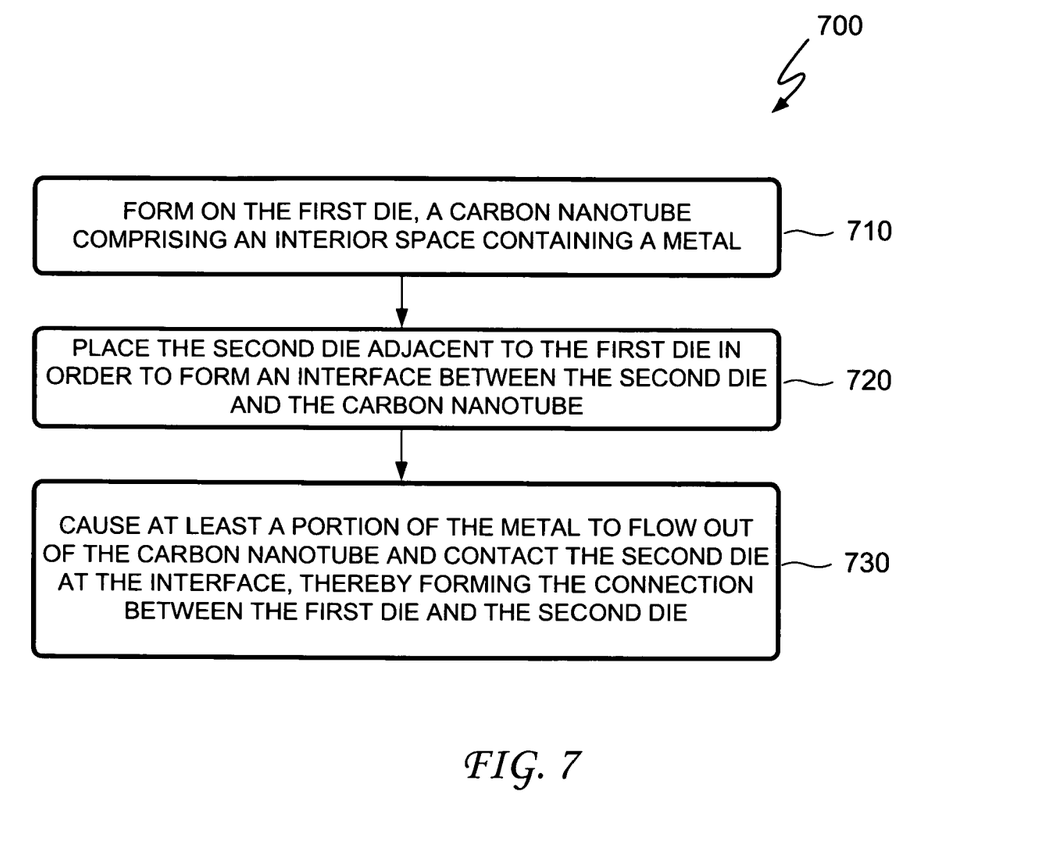
FIG. 7 is a flowchart illustrating a method of forming a connection between a first die and a second die of a multiple die structure according to another embodiment of the invention.

FIG. 7 is a flowchart illustrating a method 700 of forming a connection between a first die and a second die of a multiple die structure according to an embodiment of the invention. In at least one embodiment, the connection is both a physical and an electrical connection. As an example, method 700 may result in the formation of a multiple die structure that is similar to multiple die structure 100 that is shown in FIG. 1.

A step 710 of method 700 is to form (e.g., grow) on the first die a carbon nanotube comprising an interior space containing a metal. As an example, the carbon nanotube can be similar to carbon nanotube 410 that is shown in FIG. 4. In one embodiment, step 710 comprises growing the carbon nanotube using plasma-assisted chemical vapor deposition. In the same or another embodiment, step 710 comprises (or further comprises) using an alkali-doped catalyst. In the same or another embodiment, step 710 comprises growing the carbon nanotube only on a metallized area of the first die. This may be accomplished using techniques known in the art, such as photolithography, physical masks, and the like.

A step 720 of method 700 is to place the second die adjacent to the first die in order to form an interface between the second die and the carbon nanotube.

A step 730 of method 700 is to cause at least a portion of the metal to flow out of the carbon nanotube and contact the second die at the interface, thereby forming the connection between the first die and the second die. In one embodiment, step 730 comprises applying a voltage difference across the interface.

Figure 8:
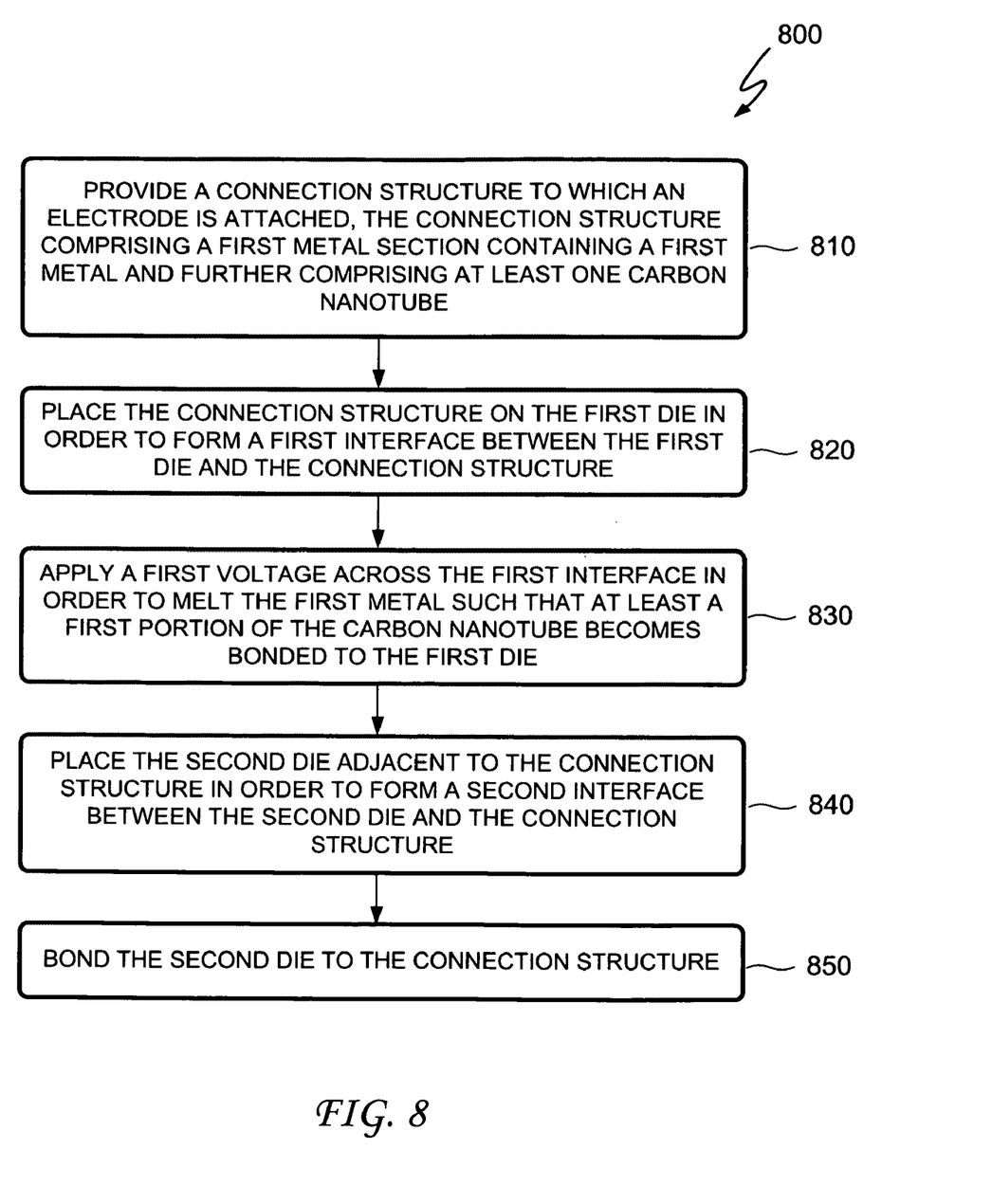
FIG. 8 is a flowchart illustrating a method of forming a connection between a first die and a second die of a multiple die structure according to another embodiment of the invention.

FIG. 8 is a flowchart illustrating a method 800 of forming a connection between a first die and a second die of a multiple die structure according to an embodiment of the invention. In at least one embodiment, the connection is both a physical and an electrical connection. As an example, method 800 may result in the formation of a multiple die structure that is similar to multiple die structure 100 that is shown in FIG. 1.

A step 810 of method 800 is to provide a connection structure to which an electrode is attached, the connection structure comprising a first metal section containing a first metal and further comprising at least one carbon nanotube. As an example, the connection structure can contain a number of connections structures that are similar to connection structure 500 that is shown in FIG. 5 (which, as may be seen in the figure and as is described above, further includes a second metal section adjacent to the carbon nanotube, with the second metal section containing a second metal). As another example, the connection structure can contain a number of connection structures that are similar to connection structure 600 that is shown in FIG. 6 (which, as may be seen in the figure and as described above, comprises a metal-filled carbon nanotube and a single metal section).

Figure 9:
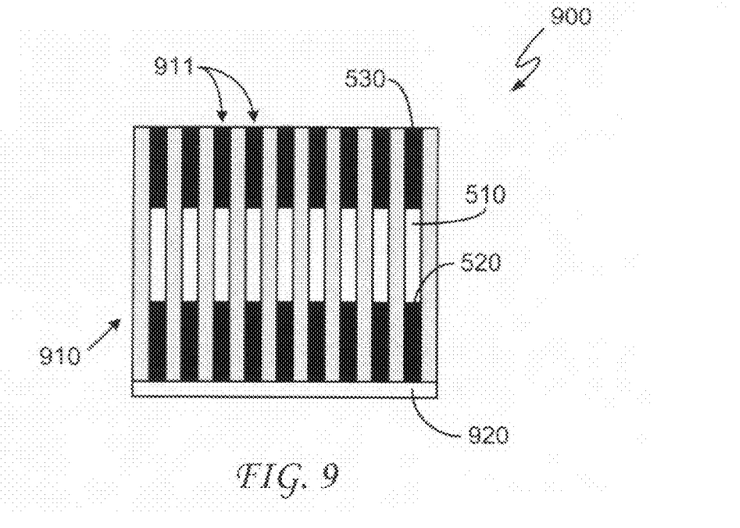
FIG. 9 is a cross-sectional view of another connection structure according to an embodiment of the invention.

FIG. 9 is a cross-sectional view of another connection structure—connection structure 900—according to an embodiment of the invention and that may be used in conjunction with method 800 (or with other methods according to other embodiments of the invention). As illustrated in FIG. 9, connection structure 900 comprises a template 910 to which an electrode 920 is attached. Template 910 provides spaces 911 in which a metal nanowire/carbon nanotube hybrid structure—similar to that shown in FIG. 5—may be formed. As depicted in FIG. 9, template 910 contains a plurality of such metal nanowire/carbon nanotube hybrid structures. In other embodiments, the template may instead contain connection structures that are similar to those shown in FIGS. 4 and 6, or may contain other types of connection structures similar to those described herein.

In one embodiment, providing a connection structure such as connection structure 900 begins with providing a series of anodic alumina (or similar) structures to serve as the template. Dense arrays of hybrid CNTs are easily fabricated using alumina templates, as known in the art. The template can be kept for easy manipulation of the arrays and etched away (or otherwise removed) once the CNTs are in place, as described below, or it can be removed immediately upon completion of CNT fabrication. After the template is provided the electrode is then plated or otherwise deposited along one edge of the template and the first metal is plated or otherwise formed within the template adjacent to the electrode. The next step is to grow the carbon nanotubes (e.g., by using chemical vapor deposition (CVD) techniques or the like) within the template adjacent to the first metal. In particular embodiments, providing the connection structure further comprises plating a second metal section within the template adjacent to the carbon nanotubes.

The foregoing paragraph has disclosed one method of fabricating a bundle of aligned CNTs (which are described as part of a hybrid metal-CNT-metal structure). Another method of fabricating bundles of aligned CNTs is to deposit an alkali-doped copper catalyst on one of the dies and to then grow CNTs using a plasma enhanced CVD (PECVD) method. This process produces copper-filled CNTs like those shown in FIG. 4 that are fabricated directly on the die itself. Alternatively, a similar process could be used to grow and pattern CNTs elsewhere, after which the CNTs could be transferred onto the die. In this alternative process, the CNTs are grown on a different substrate (such as silicon) using plasma-assisted CVD on alkali doped catalysts and are patterned analogous to the die bump field. (Or the CNTs may be formed using other methods such as the HiPCO (high pressure catalytic decomposition of carbon monoxide) method or the like.) The tubes are then aligned over a die that is bonded to the substrate and a voltage is applied. As with other embodiments, the metal in the CNTs flows out to form a joint. Since the resulting adhesion is much stronger than that to the substrate on which it was grown, the CNTs are transferred to the die. A second die is then placed over the CNTs and a reverse voltage is applied which causes the rest of the metal inside to flow out and bond to the second die. Since the rate of flow is very slow, a good control of the amount of the metal that comes out can be exercised, ensuring there is enough metal to bond to both sides. Another version of this embodiment is to have CNTs attached to both die and when the dies are bonded together it is because of the interconnection of the CNTs.

Figure 10:
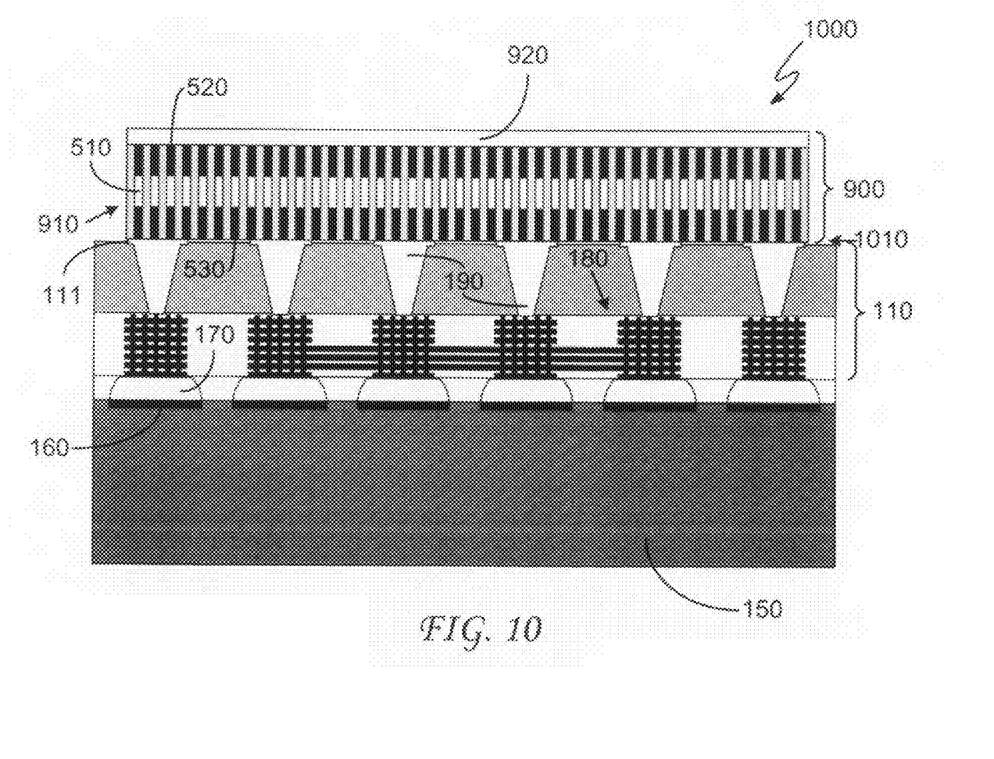
FIGS. 10-14 are cross-sectional views of a multiple die structure at various points in its manufacturing process according to an embodiment of the invention.

A step 820 of method 800 is to place the connection structure on the first die in order to form a first interface between the first die and the connection structure. In embodiments where the connection structure includes a template (e.g., similar to template 910), step 820 can comprise placing the template on the first die. A result of the performance of step 820 according to an embodiment of the invention is shown in FIG. 10, which is a cross-sectional view of a multiple die structure 1000 at a particular point in its manufacturing process according to an embodiment of the invention. As illustrated in FIG. 10, multiple die structure 1000 comprises die 110 and associated connection structure 111, substrate 150, electrically conductive pads 160, solder bumps 170, circuitry 180, and TSVs 190. In accordance with step 820 of method 800, connection structure 900 has been placed on die 110 in order to form an interface 1010 between die 110 and connection structure 900. Note that in the illustrated embodiment electrode 920 forms a continuous top layer of connection structure 900. In one embodiment electrode 920 comprises silver.

Figure 11:
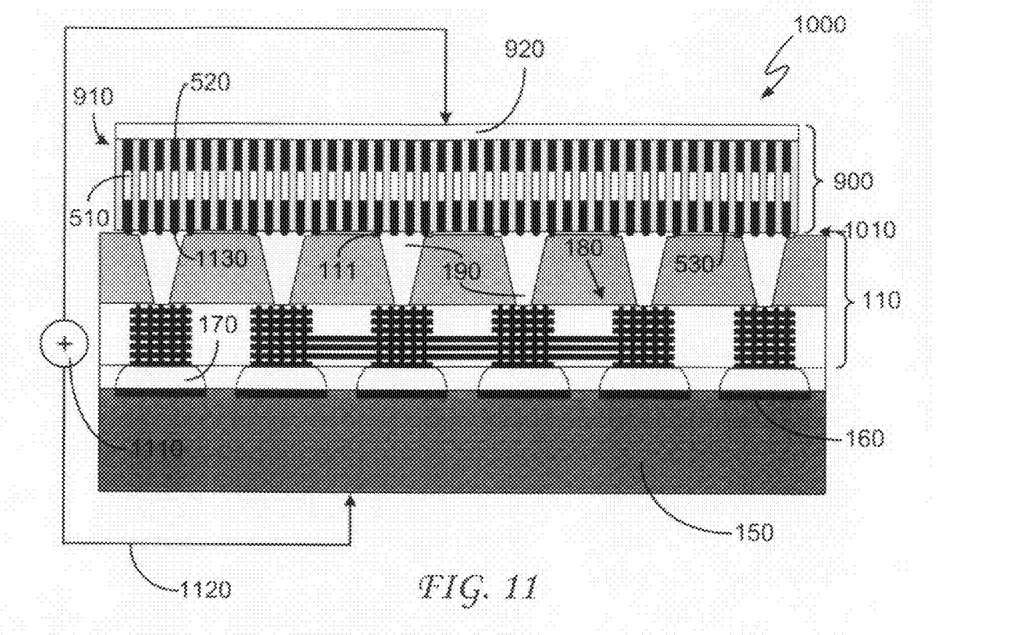

A step 830 of method 800 is to apply a first voltage across the first interface in order to melt the first metal such that at least a first portion of the carbon nanotube becomes bonded to the first die. A result of the performance of step 830 according to an embodiment of the invention is shown in FIG. 11, which is a cross-sectional view of multiple die structure 1000 at a particular point in its manufacturing process according to an embodiment of the invention. As illustrated in FIG. 11, a voltage source 1110 has been electrically connected to multiple die structure 1000 using wires 1120 in such a way that a voltage has been applied to electrode 920 and across interface 1010 in accordance with step 830. As an example, one lead (wire) of voltage source 1110 could be connected to electrode 920 and the other lead could be connected to the socket, and the current flow could take place over existing electrical pathways. As a result of this voltage, at least a portion of some of metal nanowire sections 530 have melted and then re-solidified across interface 1010 to form bond regions 1130 that bond carbon nanotube 510 to die 110. As an example, voltage source 1110 can be a direct current (DC) voltage source such as a battery pack. Two or more separate battery packs could be used where different polarities are required or desired. Alternatively, an alternating current (AC) voltage source could be used where there is a need to reverse polarity.

It should be noted that the metal nanowire sections 530 that melt and form bonding regions 1130 are those that are located in places where the circuit formed by voltage source 1110 and wires 1120 closes, e.g., those that are located at metallized areas of TSVs 190 (i.e., at connection structure 111). Those that are not in contact with a metal will not experience the voltage and therefore will not melt or form a joint.

Figure 12:
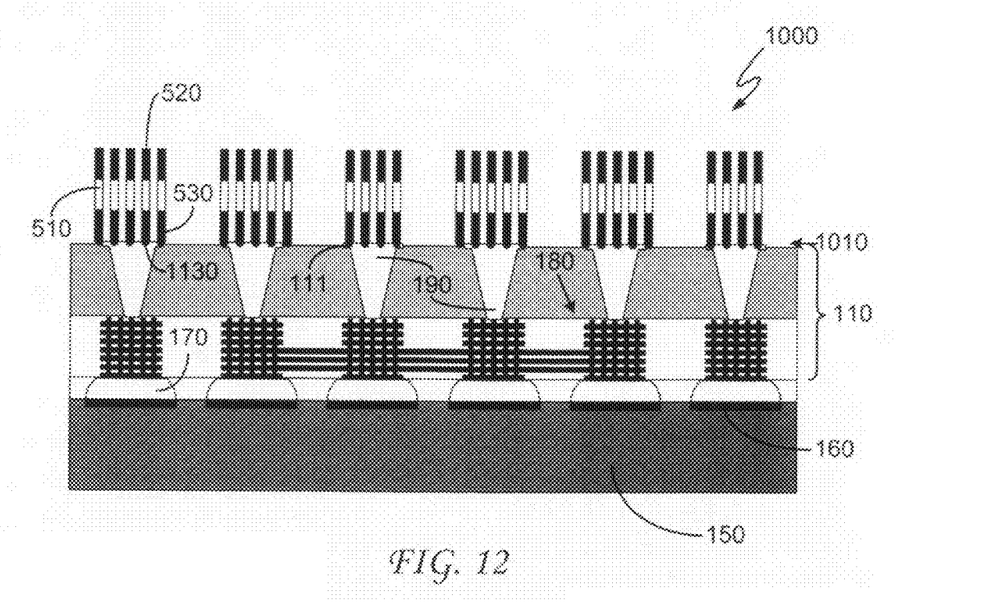

In one embodiment, following the performance of step 830 template 910 and electrode 920, along with metal nanowire sections 530 that remain unbonded, are removed. This is shown in FIG. 12, which is a cross-sectional view of multiple die structure 1000 at a particular point in its manufacturing process according to an embodiment of the invention. As an example, such removal may be accomplished by etching away the targeted features using a diluted acid solution or the like.

Figure 13:
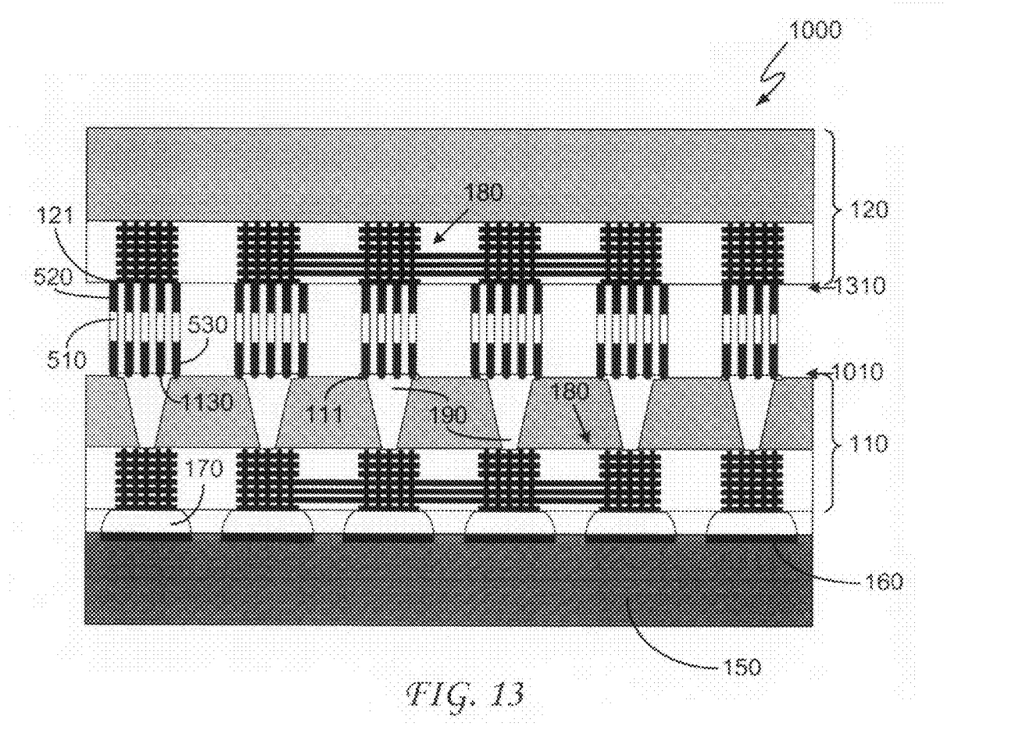

A step 840 of method 800 is to place the second die adjacent to the connection structure in order to form a second interface between the second die and the connection structure. A result of the performance of step 840 according to an embodiment of the invention is shown in FIG. 13, which is a cross-sectional view of a multiple die structure 1000 at a particular point in its manufacturing process according to an embodiment of the invention. As illustrated in FIG. 13, and in accordance with step 840, die 120 and associated connection structure 121 have been placed over the remaining portions of connection structure 900 in order to form an interface 1310 between die 120 and the remaining portions of connection structure 900.

Figure 14:
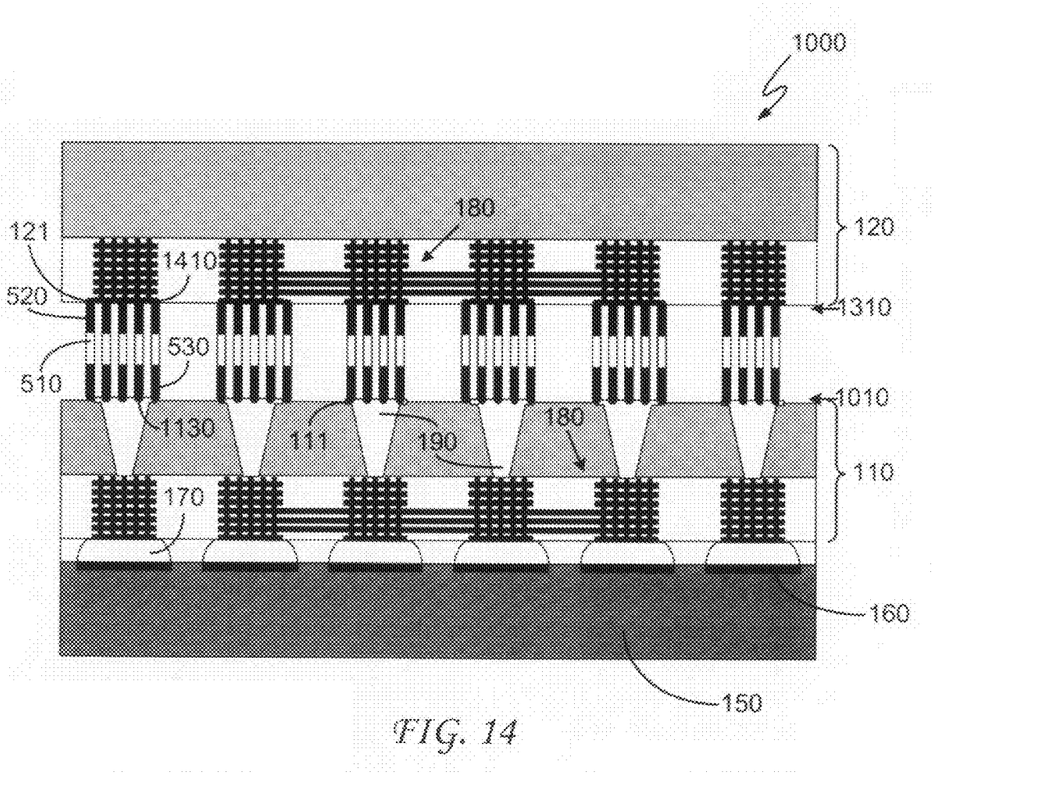

A step 850 of method 800 is to bond the second die to the connection structure. In one embodiment, step 850 comprises applying a second voltage across the second interface in order to melt at least a portion of the second metal such that at least a portion of the carbon nanotube becomes bonded to the second die. The voltage can have, but does not have to have, the same magnitude as the first voltage. A result of the performance of step 850 according to an embodiment of the invention is shown in FIG. 14, which is a cross-sectional view of multiple die structure 1000 at a particular point in its manufacturing process according to an embodiment of the invention. As illustrated in FIG. 14, a voltage has been applied across interface 1310, or some other action in accordance with step 850 has taken place, as a result of which at least a portion of metal nanowire sections 520 have melted and then re-solidified across interface 1310 to form bond regions 1410 that bond carbon nanotube 510 to die 210.

In another embodiment, the carbon nanotubes of the connection structure may, as mentioned above, be similar to those shown in FIGS. 4 and 6, in that the carbon nanotubes comprise an interior space in which the second metal is contained. In that embodiment, step 850 can comprise applying a second voltage across the second interface in order to cause at least a portion of the second metal to flow out of the carbon nanotubes and contact the second die at the second interface. The second metal, which is then in physical contact with both the carbon nanotube and the second die, re-solidifies and forms an electrically conductive joint in the manner that has been explained above.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the multiple die structure and the related connection structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of forming a connection between a first die and a second die of a multiple die structure, the method comprising:
   providing a connection structure comprising an electrically conductive material contained within an interior space of a carbon nanotube;
   placing the connection structure adjacent to the first die in order to form a first interface between the first die and the connection structure;
   placing the second die adjacent to the connection structure in order to form a second interface between the second die and the connection structure; and
   bonding the first die to the connection structure by applying a first voltage across the first interface in order to cause at least a portion of the electrically conductive material to flow out of the carbon nanotube and contact the first die at the first interface, and bonding the second die to the connection structure by applying a second voltage across the second interface in order to cause at least a portion of the electrically conductive material to flow out of the carbon nanotube and contact the second die at the second interface.

2. A method of forming a connection between a first die and a second die of a multiple die structure, the method comprising:
   providing a connection structure comprising an electrically conductive material adjacent to a carbon nanotube, wherein the electrically conductive material of the connection structure is located at least at a first end and at a second end of the carbon nanotube;
   placing the connection structure adjacent to the first die in order to form a first interface between the first die and the connection structure;
   placing the second die adjacent to the connection structure in order to form a second interface between the second die and the connection structure; and
   bonding the first die to the connection structure by applying a first voltage across the first interface and a second voltage across the second interface in order to melt the electrically conductive material such that the first die and the second die become bonded to the carbon nanotube.

3. A method of forming a connection between a first die and a second die of a multiple die structure, the method comprising:
   forming a carbon nanotube on the first die, the carbon nanotube comprising an interior space containing a metal;
   placing the second die adjacent to the first die in order to form an interface between the second die and the carbon nanotube; and
   causing at least a portion of the metal to flow out of the carbon nanotube and contact the second die at the interface, thereby forming the connection between the first die and the second die.

4. The method of claim 3 wherein:
   causing at least a portion of the metal to flow out of the carbon nanotube comprises applying a voltage difference across the interface.

5. The method of claim 3 wherein;
   forming the carbon nanotube comprises growing the carbon nanotube using plasma-assisted chemical vapor deposition.

6. The method of claim 5 wherein:
   growing the carbon nanotube further comprises using an alkali-doped catalyst.

7. The method of claim 3 wherein:
   forming the carbon nanotube comprises growing the carbon nanotube only on a metallized area of the first die.

8. A method of forming a connection between a first die and a second die of a multiple die structure, the method comprising:
   providing a connection structure to which an electrode is attached, the connection structure comprising a first metal section containing a first metal and further comprising at least one carbon nanotube;
   placing the connection structure on the first die in order to form a first interface between the first die and the connection structure;
   applying a first voltage across the first interface in order to melt the first metal such that at least a first portion of the carbon nanotube becomes bonded to the first die;
   placing the second die adjacent to the connection structure in order to form a second interface between the second die and the connection structure; and
   bonding the second die to the connection structure.

9. The method of claim 8 wherein:
   the connection structure further comprises a second metal section adjacent to the carbon nanotube, the second metal section containing a second metal; and
   bonding the second die to the connection structure comprises applying a second voltage across the second interface in order to melt the second metal such that at least a second portion of the carbon nanotube becomes bonded to the second die.

10. The method of claim 8 wherein:
    the carbon nanotube comprises an interior space containing a second metal; and
    bonding the second die to the connection structure comprises applying a second voltage across the second interface in order to cause at least a portion of the second metal to flow out of the carbon nanotube and contact the second die at the second interface.

11. The method of claim 8 wherein:
applying the first voltage across the first interface comprises applying the first voltage to the electrode attached to the connection structure.

12. The method of claim 8 wherein:
providing the connection structure comprises:
   providing a template;
   depositing the electrode along one edge of the template;
   plating the first metal within the template adjacent to the electrode; and
   growing the carbon nanotube within the template adjacent to the first metal.

13. The method of claim 12 wherein:
providing the connection structure further comprises plating a second metal section within the template adjacent to the carbon nanotube.

14. The method of claim 13 wherein:
placing the connection structure on the first die comprises placing the template on the first die; and
the method further comprises removing the template and the electrode after applying the first voltage.

15. The method of claim 14 wherein:
removing the template and the electrode comprises etching away the template and the electrode using a diluted acid solution.

* * * * *